United States Patent [19]

Fazan et al.

[11] Patent Number: 5,629,230
[45] Date of Patent: May 13, 1997

[54] SEMICONDUCTOR PROCESSING METHOD OF FORMING FIELD OXIDE REGIONS ON A SEMICONDUCTOR SUBSTRATE UTILIZING A LATERALLY OUTWARD PROJECTING FOOT PORTION

[75] Inventors: Pierre C. Fazan; Nanseng Jeng; David L. Dickerson, all of Boise, Id.

[73] Assignee: Micron Technology, Inc., Boise, Id.

[21] Appl. No.: 509,782

[22] Filed: Aug. 1, 1995

[51] Int. Cl.⁶ .................................................. H01L 21/76
[52] U.S. Cl. ........................ 438/446; 438/448; 438/696
[58] Field of Search .................... 437/40 R, 40 SW, 437/41 SW, 69, 70, 72, 67; 148/DIG. 117, DIG. 118

[56] References Cited

U.S. PATENT DOCUMENTS

| | | | |
|---|---|---|---|
| 4,927,780 | 5/1990 | Roth et al. | 437/69 |
| 5,326,715 | 7/1994 | Jang et al. | 437/69 |
| 5,360,753 | 11/1994 | Park et al. | 437/69 |
| 5,374,584 | 12/1994 | Lee et al. | 437/69 |
| 5,387,538 | 2/1995 | Moslehi | 437/67 |
| 5,393,692 | 2/1995 | Wu | 437/69 |
| 5,432,118 | 7/1995 | Orlowski et al. | 437/72 |

FOREIGN PATENT DOCUMENTS

| | | | |
|---|---|---|---|
| 57-63842 | 4/1982 | Japan | 437/73 |
| 62-296436 | 12/1987 | Japan | 437/72 |
| 1-282839 | 11/1989 | Japan | 437/72 |
| 02266545 | 10/1990 | Japan | 437/72 |

OTHER PUBLICATIONS

Park et al "A Novel Locos Type Isolation Technology Free of the Field Oxide Thinning Effect", Solid State Devices and Materials, pp. 528–530, 1993.

*Primary Examiner*—Michael Trinh
*Attorney, Agent, or Firm*—Wells, St. John, Roberts, Gregory & Matkin, P.S.

[57] ABSTRACT

A semiconductor processing method of forming a field oxide region on a semiconductor substrate includes, a) providing a patterned first masking layer over a desired active area region of a semiconductor substrate, the first masking layer having at least one side edge; b) providing a silicon sidewall spacer over the side edge of the patterned first masking layer, the silicon sidewall spacer having a laterally outward projecting foot portion; c) oxidizing the substrate and the silicon sidewall spacer to form a field oxide region on the substrate; d) stripping the first masking layer from the substrate; and e) providing a gate oxide layer over the substrate. The invention enables taking advantage of process techniques which minimize the size of field oxide bird's beaks without sacrificing upper field oxide topography.

20 Claims, 10 Drawing Sheets

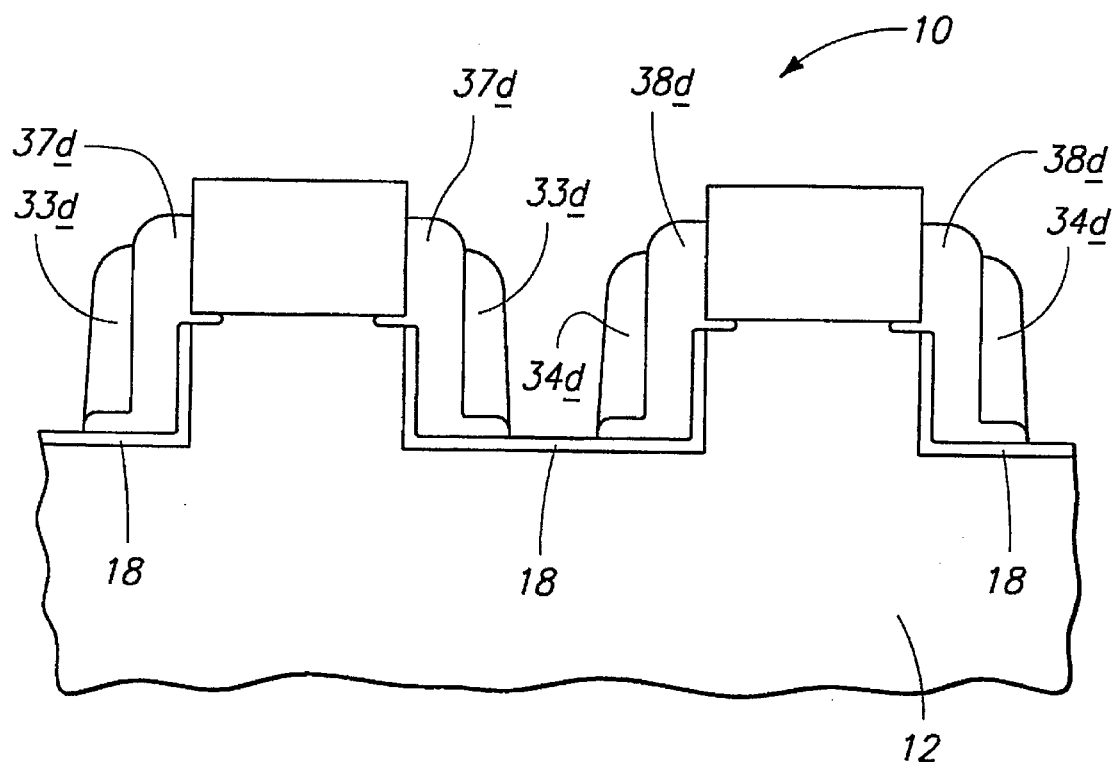
_Fig 19_
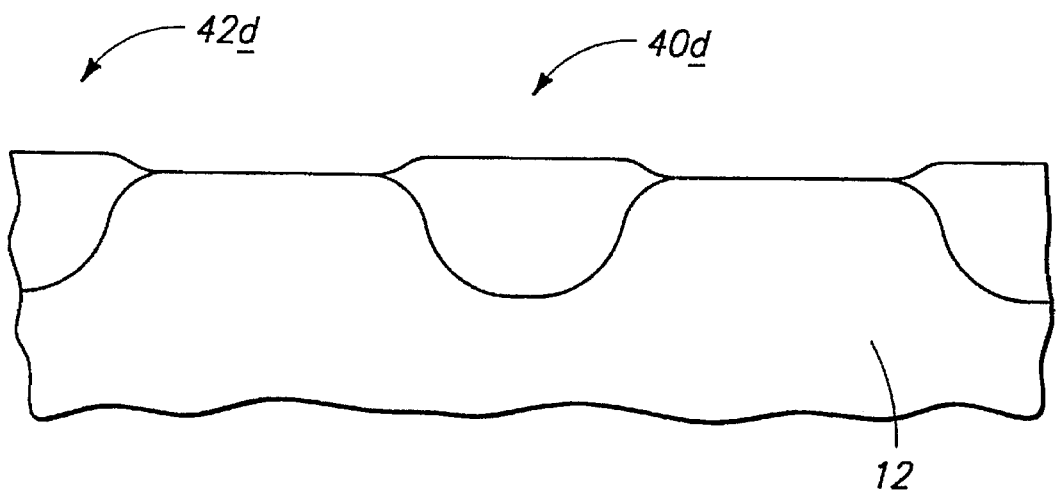
_Fig 20_

SEMICONDUCTOR PROCESSING METHOD OF FORMING FIELD OXIDE REGIONS ON A SEMICONDUCTOR SUBSTRATE UTILIZING A LATERALLY OUTWARD PROJECTING FOOT PORTION

TECHNICAL FIELD

This invention relates to semiconductor processing methods of forming field oxide regions on semiconductor substrates.

BACKGROUND OF THE INVENTION

The reduction in size of memory cells and other circuits which are required for high density dynamic random access memories (DRAMs) is a continuing goal in semiconductor fabrication. The manufacturing of electronic circuits involves the connecting of isolated devices through specific conductive paths. When fabricating silicon and other semiconductive material substrates into integrated circuits, it is necessary to isolate devices built into the substrates from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach of forming such oxide is to cover the active regions with a thin layer of silicon nitride that prevents oxidation from occurring therebeneath. The unmasked or exposed field regions of the substrate are then subjected to a wet oxidation, typically at temperatures of around 1000° C. for two to four hours. This results in field oxide growth where there is no masking nitride.

However at the edges of the nitride, some oxidant diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension of the field oxide into the active areas where the devices are formed. Although the length of the bird's beak depends upon a number of parameters, the length is typically 0.15 micron to 0.5 micron per side.

This thinner area of oxide resulting from the bird's beak provides the disadvantage of both not providing effective isolation in these regions, as well as unnecessarily consuming precious real estate on the semiconductor wafer. Accordingly, prior art techniques have been developed in the formation of field oxide which limit the size and corresponding lateral encroachment of a bird's beak into active area. One such prior art process pertinent to this invention is described with reference to FIGS. 1–10.

Referring first to FIG. 1, a prior art semiconductor wafer fragment in process is indicated generally with reference numeral 10. Such is comprised of a bulk substrate 12, a thermally grown layer 14 of SiO$_2$ and an overlying nitride layer 15. The function of layer 14, referred to as a pad or first sacrificial oxide layer, is to cushion the transition of stresses between silicon substrate 12 and nitride layer 15. Nitride layer 15 will function as the masking layer for ultimate formation of the field oxide regions.

Referring to FIG. 2, nitride layer 15 has been patterned and etched as shown to form nitride masking blocks 16 and 17. A channel-stop implant would typically be conducted prior to removing the mask, but might also be conducted later in the process. The etch to produce nitride blocks 16 and 17 is somewhat selective to the oxide of layer 14. Therefore, the etch does result in the removal of a portion of pad oxide layer 14 in an uneven manner due to the inherent non-uniformity of the etch process. Blocks 16 and 17 have opposing side edges.

Referring to FIG. 3, the wafer is subjected to a wet isotropic etch to remove remaining portions of exposed sacrificial oxide layer 14 from the substrate. This also produces undercut etching of layer 14 beneath nitride blocks 16 and 17, as shown.

Referring to FIG. 4, the wafer is subjected to oxidizing conditions to grow a second sacrificial oxide layer 18 having a thickness of from 60 Angstroms to 120 Angstroms. Layer 18 will function as a silicon etch stop, as will be apparent subsequently. Additionally, the thickness of layer 18 will affect the bird's beak size. The thicker layer 18 is, the larger will be the bird's beak size after field oxidation.

Referring to FIG. 5, a layer of polysilicon or amorphous silicon is deposited to a typical thickness of from 300 Angstroms to 1500 Angstroms. It is subsequently subjected to an anisotropic dry etch to form the illustrated silicon sidewall spacers 20 over the edges of masking blocks 16 and 17. Layer 18 serves as an etch stop to the underlying silicon during the spacer etch. Spacers 20 provide the desired effect during field oxidation of producing an oxide encroachment barrier to beneath masking blocks 16 and 17, such that the length of the bird's beak is substantially reduced.

The effect is best seen in FIG. 6. Wafer 10 is subjected to conventional wet oxidation techniques which cause silicon sidewall spacers 20 and the regions of substrate 12 not covered by blocks 16 and 17 to be oxidized to produce field oxide regions 22. The silicon of sidewall spacers 20 precludes significant oxygen encroachment to underneath adjacent nitride blocks 16 and 17 such that the illustrated birds' beaks 23 are much shorter in outward lateral expanse. Silicon sidewall spacers 20, being of a silicon material similar to substrate 12, are also oxidized during the process, essentially growing in volume to approximately twice their original size. This results in formation of what is commonly termed as "Mickey Mouse" ears 24. Unfortunately, these ears create subsequent processing problems apparent from FIGS. 7–10.

Subsequent to field oxide formation, nitride blocks 16 and 17 are stripped and wafer 10 then subjected to an oxide etch to remove second sacrificial oxide layer 18 (FIG. 7). This results in the "Mickey Mouse" ears acquiring a somewhat more sharp or pointed profile 24a.

During the previous growth of field oxide 22, an undesired phenomenon occurs that can cause defects in a subsequently provided gate oxide layer. Specifically, a thin layer of silicon nitride (not shown) can form on the silicon surface at the pad oxide/silicon interface as a result of a reaction of NH$_3$ and silicon at that interface during field oxidation. This NH$_3$ diffuses through the field oxide and the pad oxide, and reacts with the silicon substrate to form silicon-nitride spots or ribbons (not shown) which significantly adversely impact subsequent gate oxidation growth. The typical way of removing or attending to these silicon-nitride spots is by growth of a third sacrificial oxide layer 25 (FIG. 8). This layer must be removed, typically by a wet oxide strip. This unfortunately results in further etching of the field oxide regions 22 in such a manner that even more sharp upper topography points 24b are provided (FIG. 9).

These points undesirably result in increased topography, which can create photolithographic and etch difficulties in subsequent steps where polysilicon material for gate formation is provided. For example, FIG. 10 illustrates provision of a gate oxide layer 28, and subsequent provision of a polysilicon gate layer 27. Layer 27 has considerable higher topography over field oxide regions 22 than would be provided by more conventional field oxidation techniques. Accordingly, the advantage of achieving low lateral encroachment of birds' beaks of the prior art comes with a cost of adverse problems created by increasing topography, and the problems associated therewith in semiconductor wafer processing.

It would be desirable to overcome such prior art drawbacks.

BRIEF DESCRIPTION OF THE DRAWINGS

Preferred embodiments of the invention are described below with reference to the following accompanying drawings.

FIG. 19 is a diagrammatic sectional view of an alternate embodiment semiconductor wafer fragment at one processing step in accordance with the invention.

FIG. 20 is a view of the FIG. 19 wafer fragment at a processing step subsequent to that shown by FIG. 19.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a field oxide region on a semiconductor substrate comprises the following steps:

providing a patterned first masking layer over a desired active area region of a semiconductor substrate, the first masking layer having at least one side edge;

providing a silicon sidewall spacer over the side edge of the patterned first masking layer, the silicon sidewall spacer having a laterally outward projecting foot portion;

oxidizing the substrate and the silicon sidewall spacer to form a field oxide region on the substrate;

stripping the first masking layer from the substrate; and providing a gate oxide layer over the substrate.

In accordance with another aspect of the invention, a semiconductor processing method of forming at least one pair of field oxide regions on a semiconductor substrate comprises:

providing a first sacrificial oxide layer over a semiconductor substrate;

providing a patterned first masking layer over the first sacrificial oxide layer and over a desired active area region of the substrate, the first masking layer comprising a nitride;

providing a layer of silicon over the patterned first masking layer;

providing a second masking layer over the silicon layer;

anisotropically etching the second masking layer to define at least one pair of second masking layer sidewall spacers over the silicon layer and to outwardly expose portions of the silicon layer, the pair of second masking layer sidewall spacers defining an interconnected pair of masked laterally opposed and laterally outward projecting foot portions of the silicon layer;

after anisotropically etching the second masking layer, anisotropically etching the exposed portions of the silicon layer to form a pair of silicon sidewall spacers, the pair of silicon sidewall spacers having the pair of laterally opposed and laterally outward projecting foot portions; and oxidizing the substrate and the silicon sidewall spacers to form at least one pair of field oxide regions on the substrate.

Figure 1:
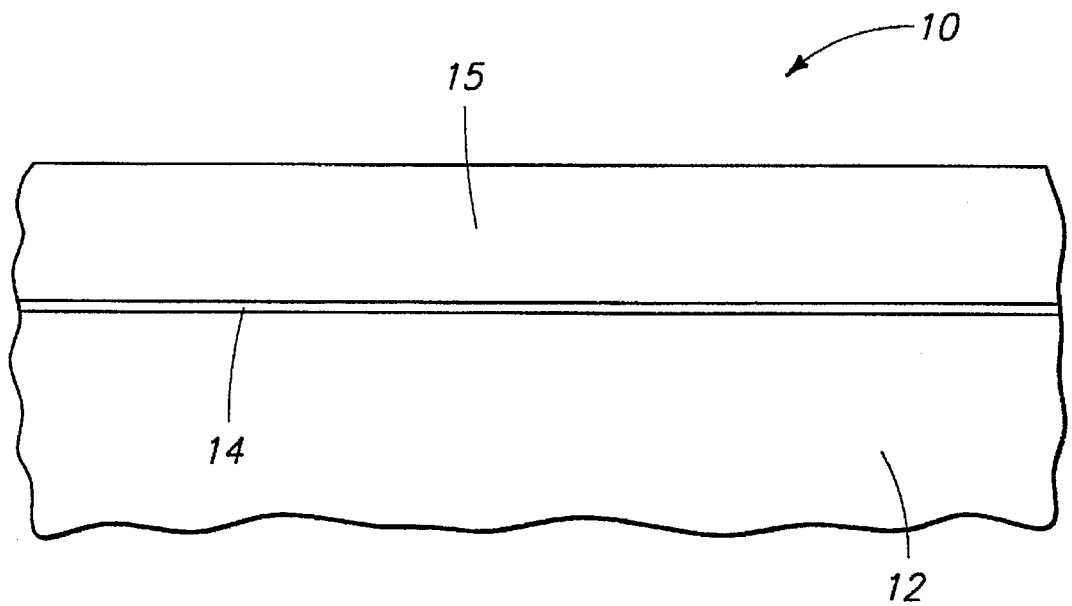
FIG. 1 is a diagrammatic section view of a prior art semiconductor wafer fragment at one prior art processing step, and is described in the "Background" section above.
Figure 2:
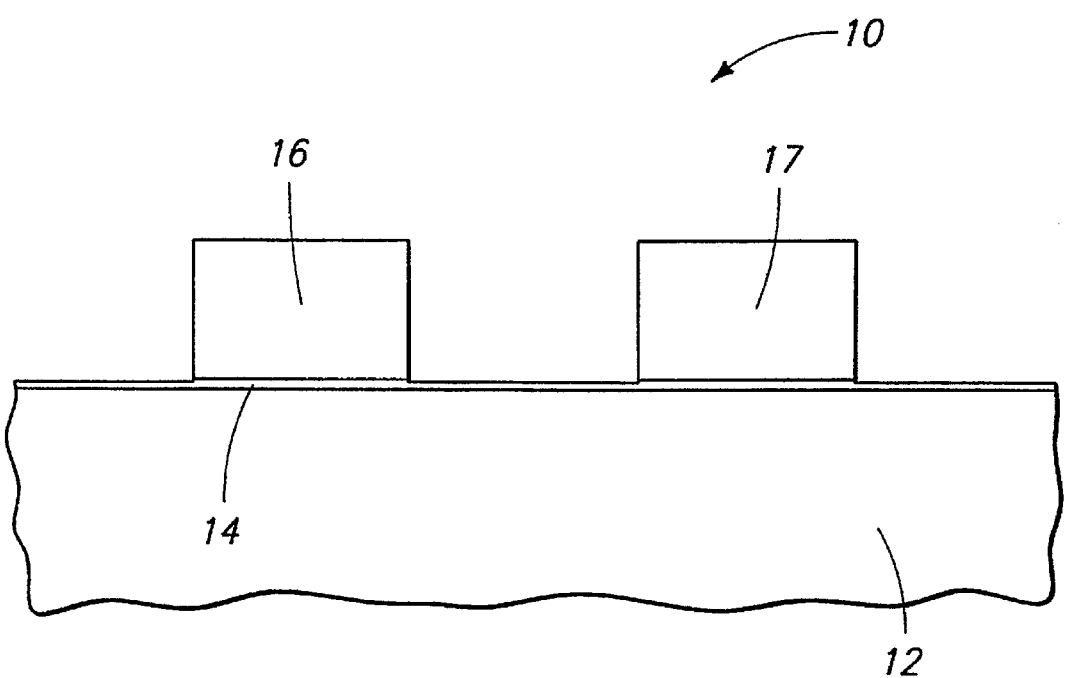
FIG. 2 is a view of the FIG. 1 wafer fragment at a processing step subsequent to that shown by FIG. 1.
Figure 3:
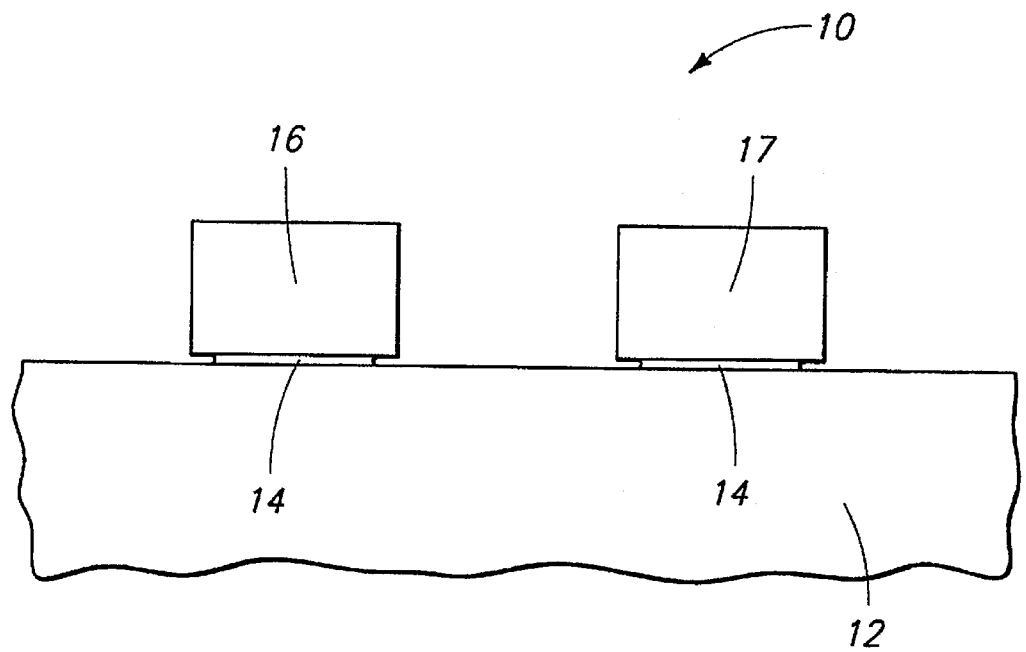
FIG. 3 is a view of the FIG. 1 wafer fragment at a processing step subsequent to that shown by FIG. 2.
Figure 4:
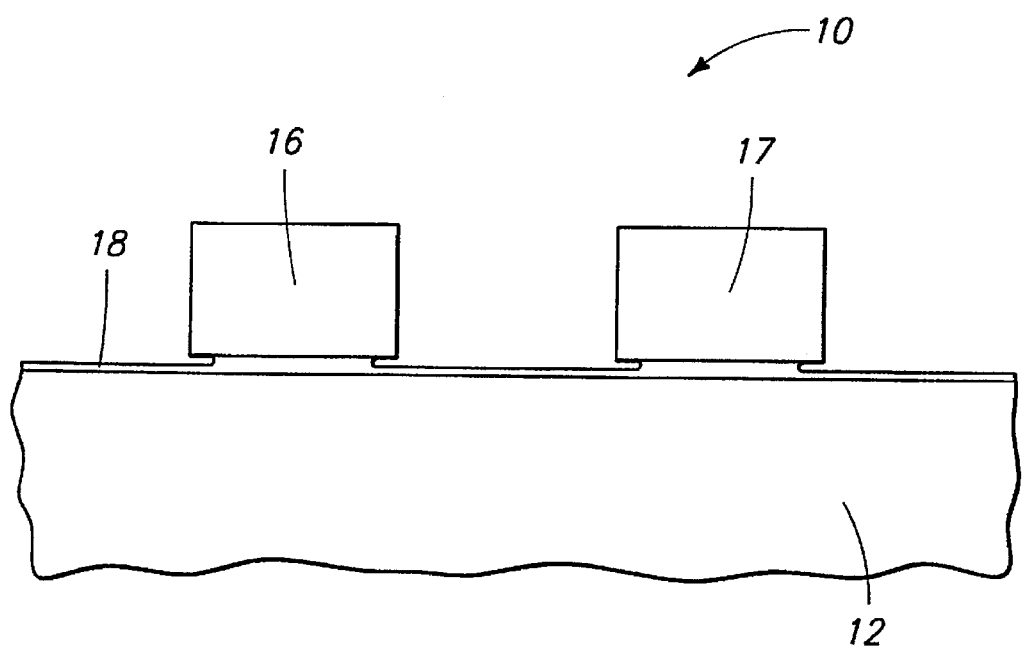
FIG. 4 is a view of the FIG. 1 wafer fragment at a processing step subsequent to that shown by FIG. 3.
Figure 5:
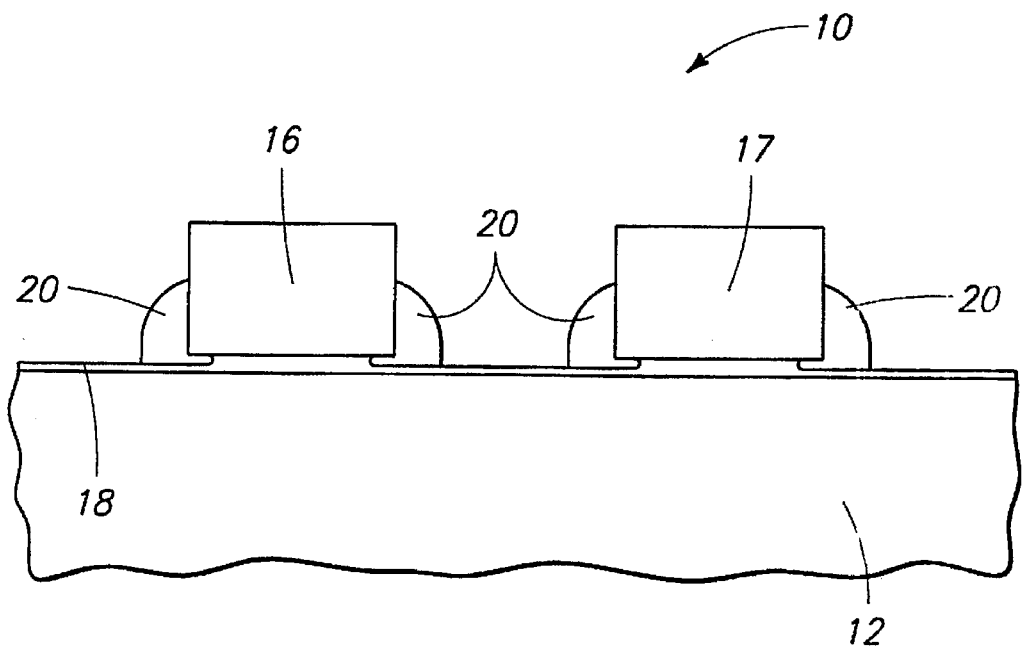
FIG. 5 is a view of the FIG. 1 wafer fragment at a processing step subsequent to that shown by FIG. 4.
Figure 6:
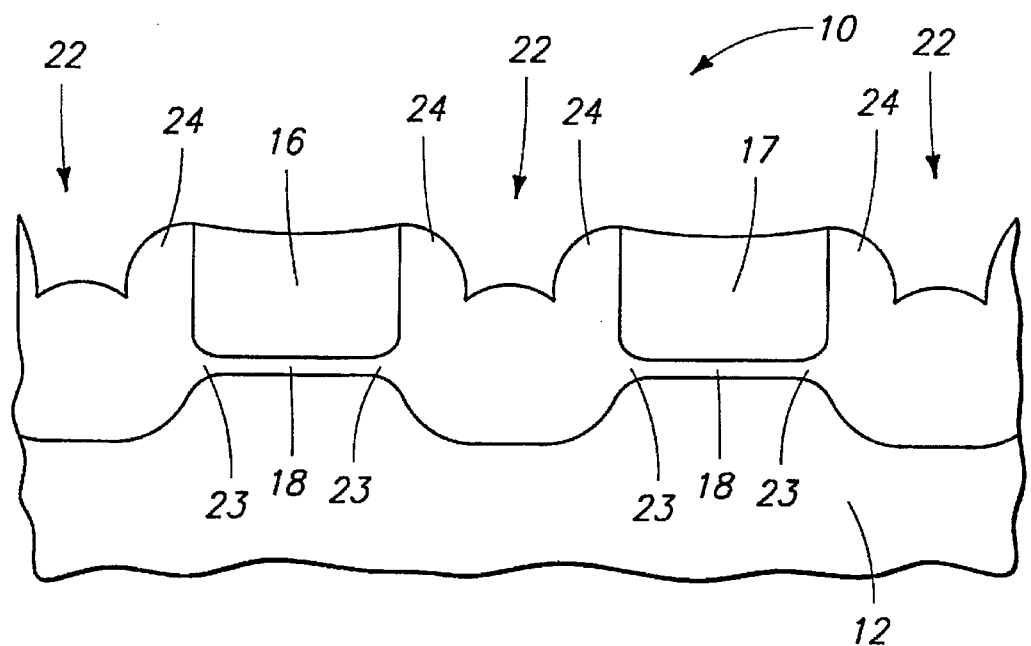
FIG. 6 is a view of the FIG. 1 wafer fragment at a processing step subsequent to that shown by FIG. 5.
Figure 7:
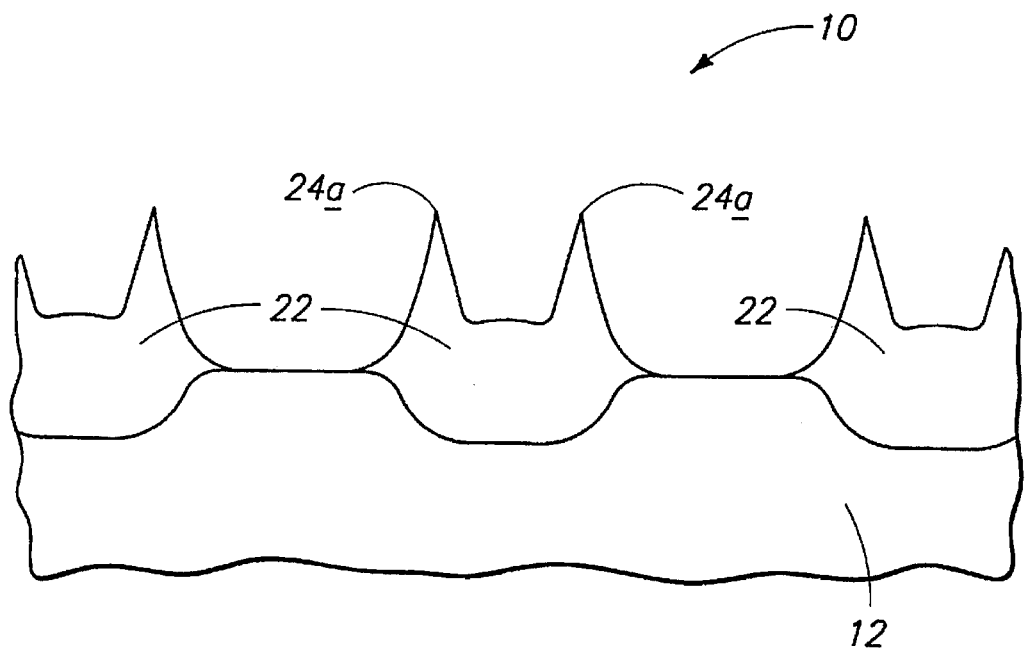
FIG. 7 is a view of the FIG. 1 wafer fragment at a processing step subsequent to that shown by FIG. 6.
Figure 8:
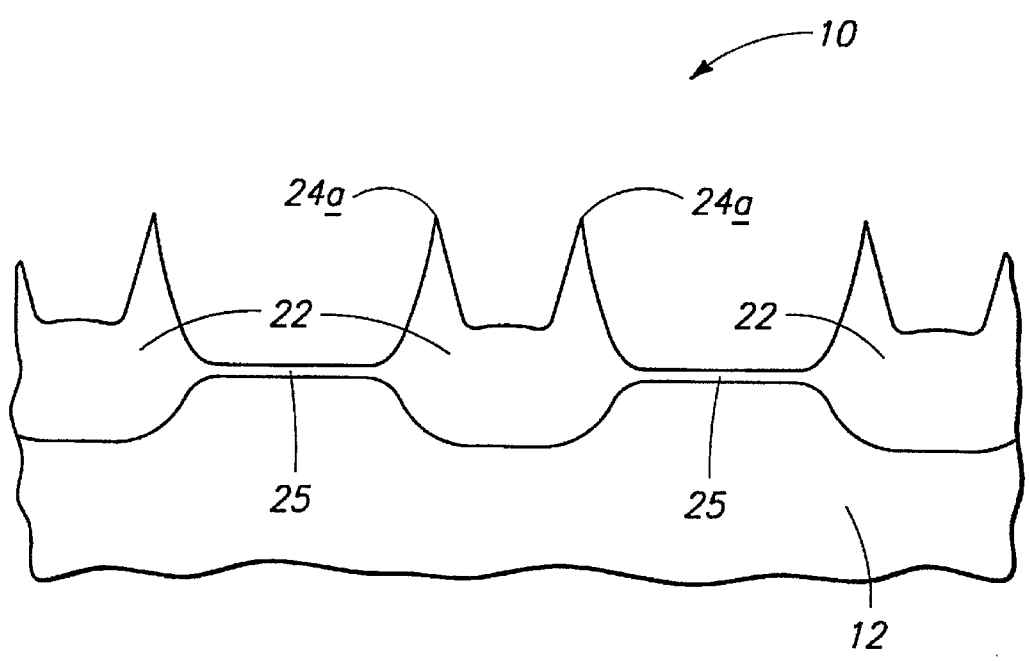
FIG. 8 is a view of the FIG. 1 wafer fragment at a processing step subsequent to that shown by FIG. 7.
Figure 9:
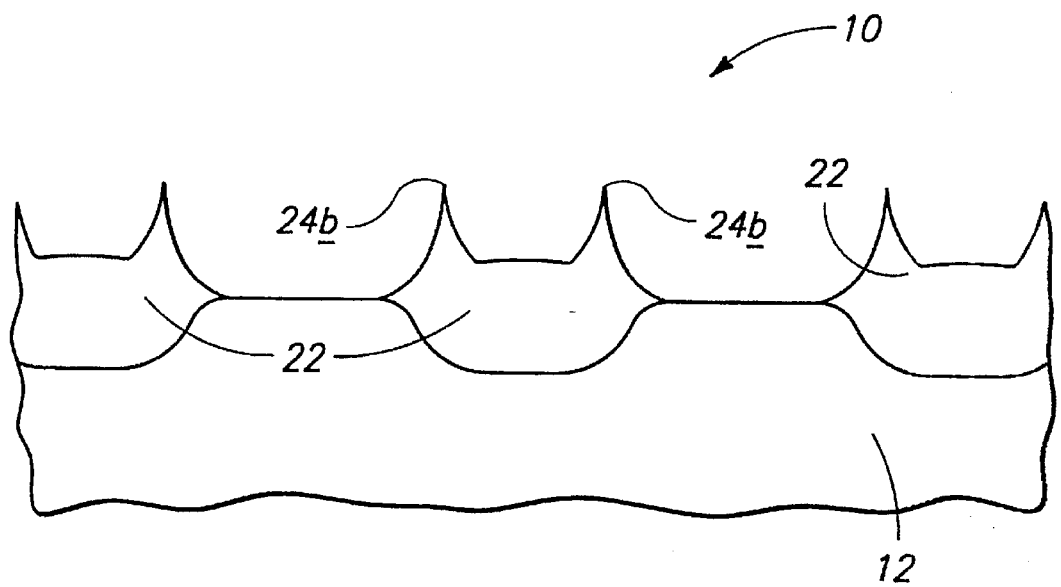
FIG. 9 is a view of the FIG. 1 wafer fragment at a processing step subsequent to that shown by FIG. 8.
Figure 10:
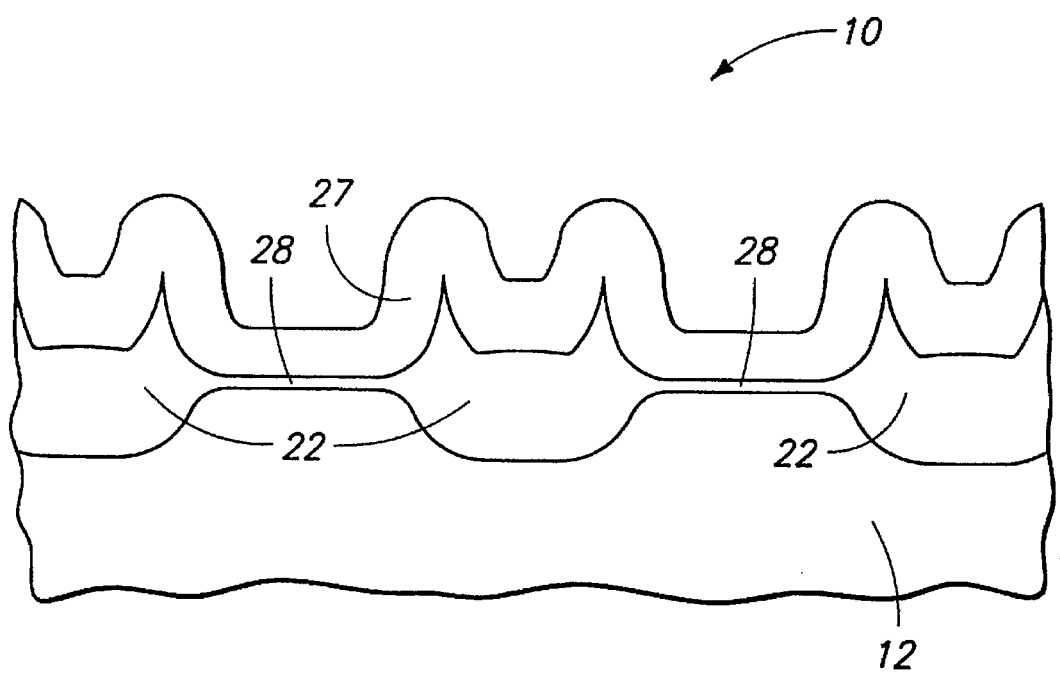
FIG. 10 is a view of the FIG. 1 wafer fragment at a processing step subsequent to that shown by FIG. 9.
Figure 11:
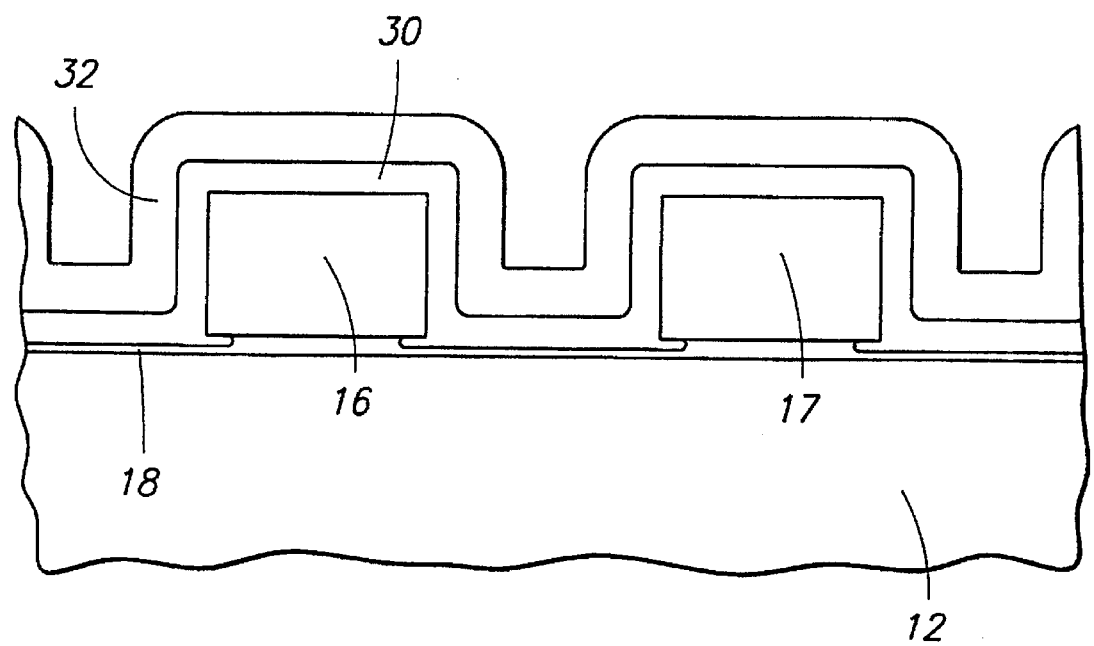
FIG. 11 is a diagrammatic sectional view of a semiconductor wafer fragment at one processing step in accordance with the invention.

The discussion first proceeds with reference to FIGS. 11–18 for a description of a preferred method in accordance with the invention. Like numerals from the above described prior art FIGS. 1–10 embodiment are utilized where appropriate, with differences of any significance being indicated with different numerals. FIG. 11 starts in sequence after FIG. 4 of the above described embodiment.

Referring to FIG. 11, nitride blocks 16 and 17 are formed from a first masking layer, and a layer 30 of silicon is provided over patterned first masking layer nitride blocks 16 and 17, and over second sacrificial oxide layer 18. Provision of layer 18 might be eliminated, with the invention only being limited by the accompanying claims appropriately interpreted in accordance with the doctrine of equivalents. A preferred material for layer 30 is polysilicon deposited to a thickness ranging from 200 Angstroms to 1000 Angstroms. Alternate materials, by way of example only, include amorphous silicon and porous silicon. Subsequently, a second masking layer 32 is provided over silicon layer 30 also to a preferred thickness of from 200 Angstroms to 1000 Angstroms. Layer 32 preferably constitutes a material which is selectively etchable relative to underlying silicon material 30. Example preferred materials include $SiO_2$ and $Si_3N_4$, with $SiO_2$ being most preferred. The thickness of layer 32 is used to set the length of the foot portion independent of the first spacer height, as will be apparent subsequently.

Figure 12:
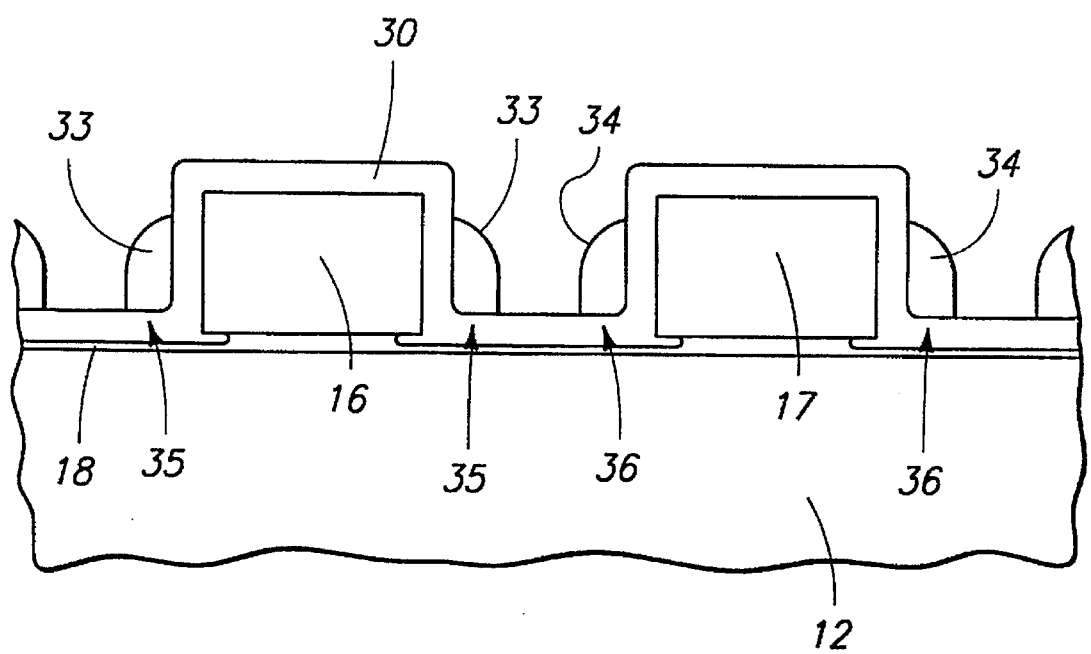
FIG. 12 is a view of the FIG. 11 wafer fragment at a processing step subsequent to that shown by FIG. 11.

Referring to FIG. 12, second masking layer 32 is anisotropically etched to define pairs 33 and 34 of second masking layer sidewall spacers over silicon layer 30, and to outwardly expose portions of silicon layer 30. The anisotropic etch is preferably conducted selectively relative to silicon layer 30, as shown. Pairs 33 and 34 of second masking sidewall spacers define interconnected respective pairs 35 and 36 of respective masked laterally opposed and outward projecting foot portions of silicon layer 30.

Figure 13:
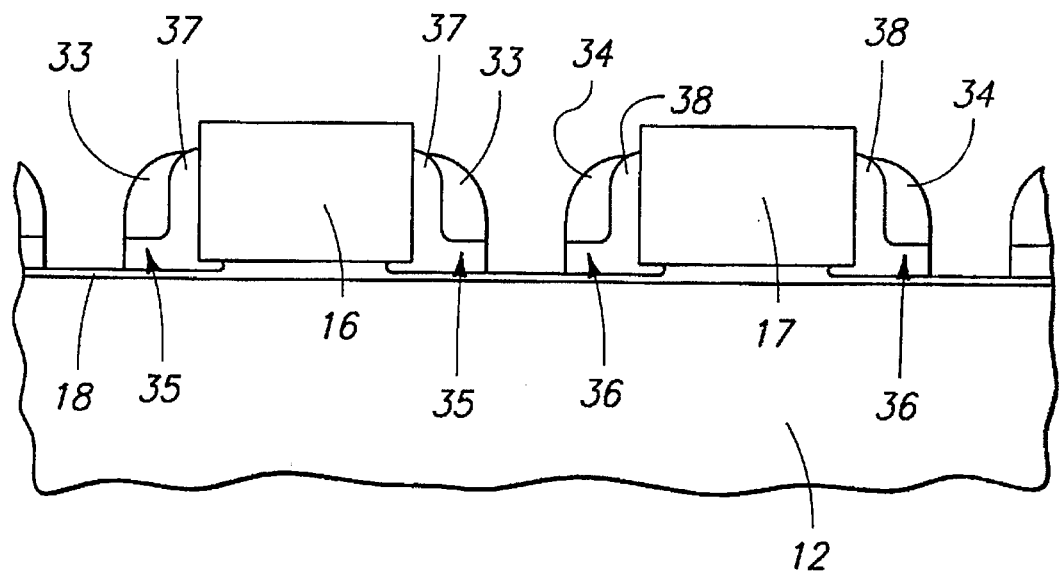
FIG. 13 is a view of the FIG. 11 wafer fragment at a processing step subsequent to that shown by FIG. 12.

Referring to FIG. 13, exposed portions of silicon layer 30 are anisotropically etched selectively relative to second sacrificial oxide layer 18 to form respective pairs 37 and 38 of silicon sidewall spacers. Silicon sidewall spacer pair 37 includes laterally opposed and laterally outward foot portion pair 35, while silicon sidewall spacer pair 38 comprises laterally opposed and laterally outward projecting foot portion pair 36.

Figure 14:
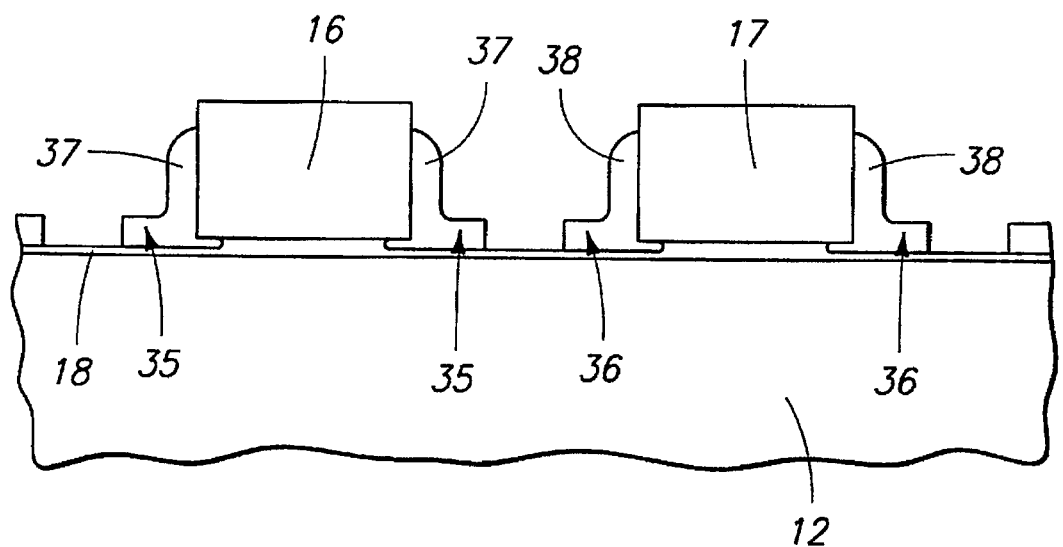
FIG. 14 is a view of the FIG. 11 wafer fragment at a processing step subsequent to that shown by FIG. 13.

Referring to FIG. 14, second masking layer sidewall spacers 33 and 34 are stripped from the substrate. Alternately, these spacers can remain at this point in the process and be stripped after field oxidation. Further as an alternate, spacers 33 and 34 might remain after field oxidation. Most preferred is removal of such spacers now as shown in FIG. 14.

Figure 15:
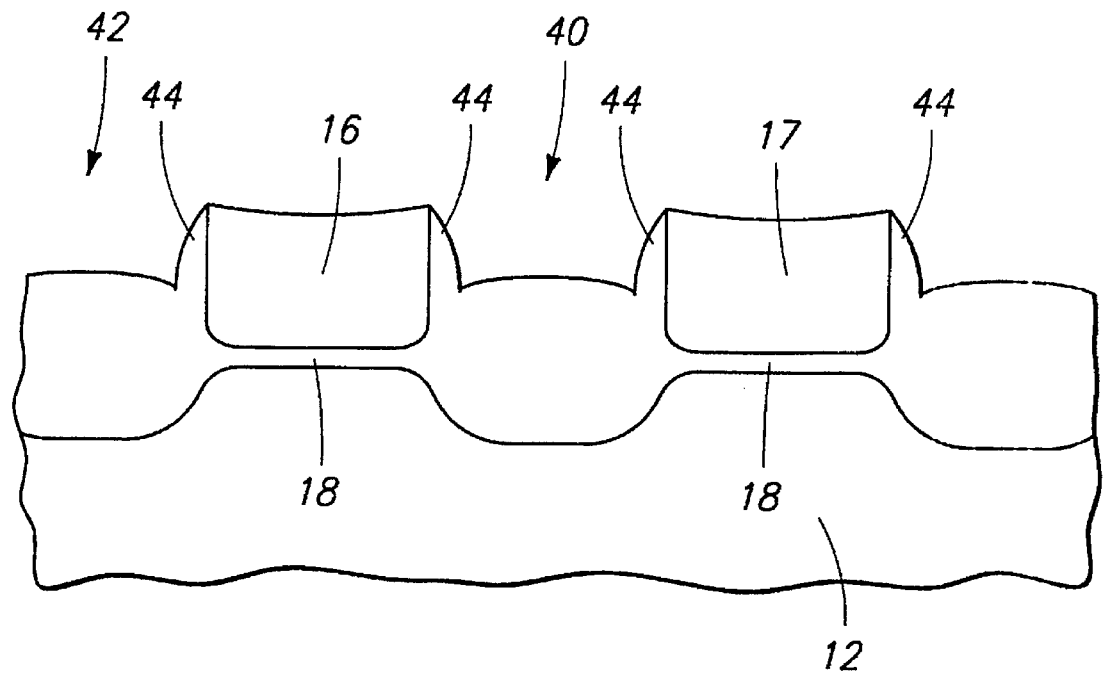
FIG. 15 is a view of the FIG. 11 wafer fragment at a processing step subsequent to that shown by FIG. 14.

Referring to FIG. 15, the wafer is subjected to oxidizing conditions to oxidize the silicon of bulk substrate 12 and silicon sidewall spacers 37 and 38 to form the illustrated pair 40 and 42 of field oxide regions. During such oxidation, the elongated foot portions 35 and 36 (FIG. 14) provide adequate lateral displacement to prevent significant oxygen encroachment to minimize bird's beak formation beneath nitride blocks 16 and 17. Further, the desired and preferred thinner nature of the deposited layer of silicon 30 which ultimately forms silicon spacers 37 and 38 results in smaller (thinner) "Mickey Mouse" ears 44. This provides the subsequent advantage of minimizing upper topography of the resultant field oxide regions.

Figure 16:
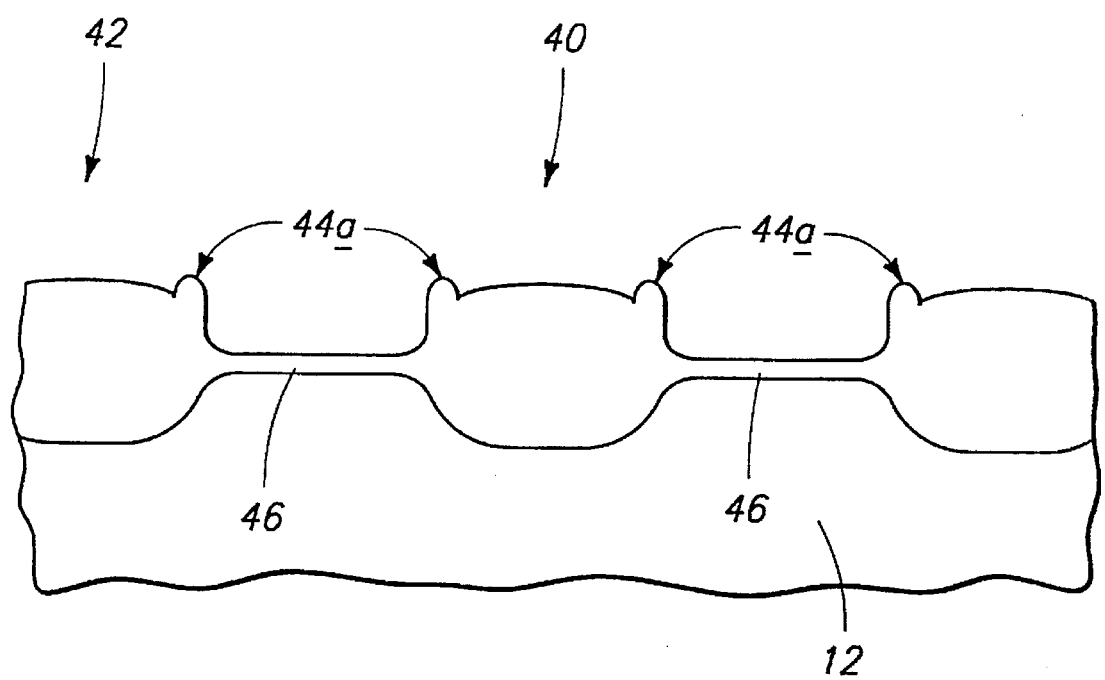
FIG. 16 is a view of the FIG. 11 wafer fragment at a processing step subsequent to that shown by FIG. 15.

Specifically, FIG. 16 illustrates stripping of first masking layer material blocks 16 and 17 from the substrate, and subsequent stripping of second sacrificial oxide layer material 18. Further, essentially any remnants of first sacrificial oxide layer 14 which might be remaining would also be removed. Optionally, an additional oxide strip might be conducted prior to stripping blocks 16 and 17 to remove any oxide which formed thereatop during the previous oxidizing step. Regardless, the oxide strip also removes a portion of the upper portions of field oxide regions 40 and 42, resulting in reduced ears 44a. Subsequently, a third sacrificial oxide layer 46 is grown to clean off the silicon substrate for the upcoming gate oxide formation.

Figure 17:
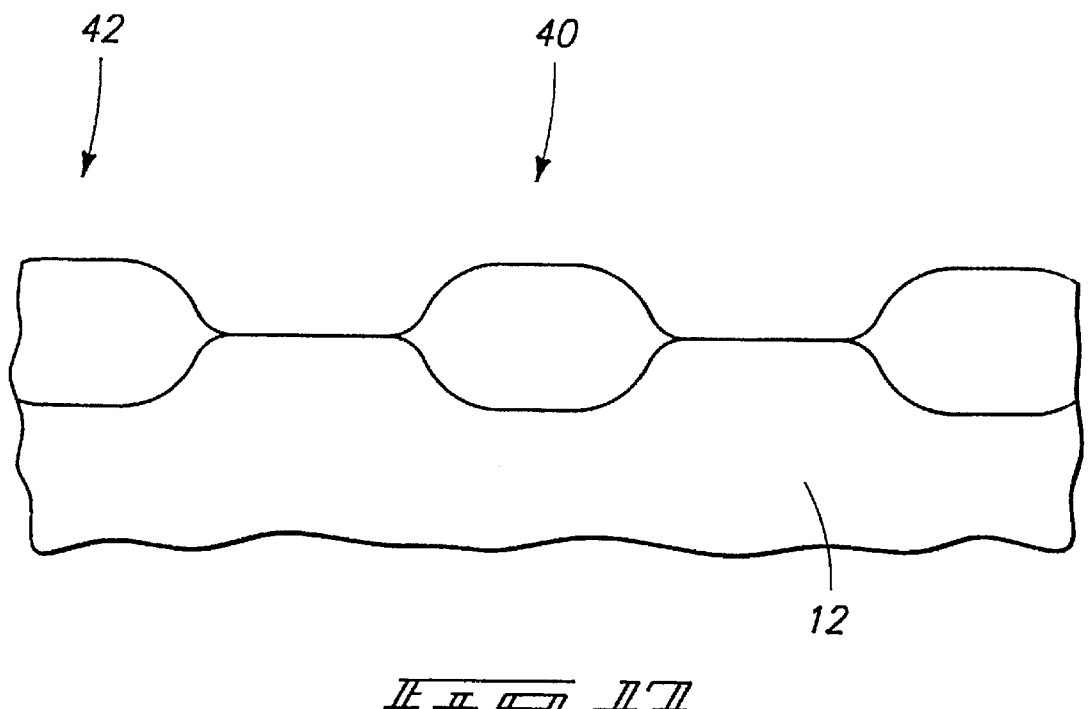
FIG. 17 is a view of the FIG. 11 wafer fragment at a processing step subsequent to that shown by FIG. 16.
Figure 18:
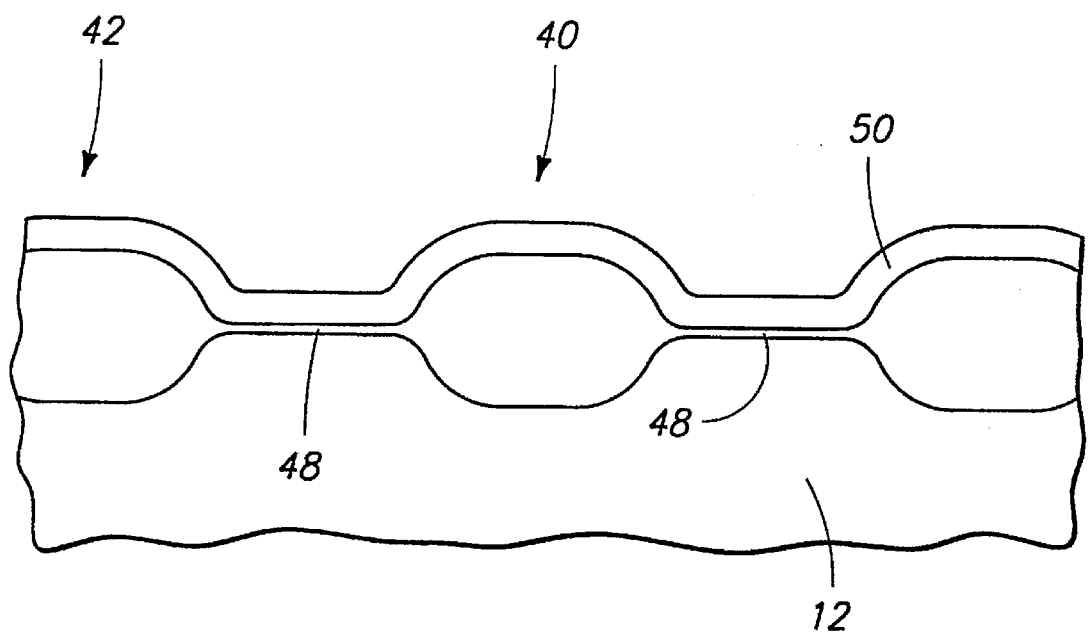
FIG. 18 is a view of the FIG. 11 wafer fragment at a processing step subsequent to that shown by FIG. 17.

Referring to FIG. 17, third sacrificial oxide layer 46 is stripped from the substrate. Such also etches a portion of the upper surface of field oxide regions 40 and 42, and desirably has the effect of essentially eliminating the sharp points 44a to produce an upper smooth topography for such field oxide regions. Accordingly, a subsequently deposited or grown gate oxide layer 48 and polysilicon gate layer 50 (FIG. 18) have considerably smoother and acceptable topography, the result of not having to conform to sharp points provided atop the field oxide regions.

The above described embodiment provides a semi-recessed formation of field oxide regions relative to substrate 12. FIGS. 19 and 20 illustrate alternate process sequences whereby fully or substantially recessed field oxide regions are provided within the substrate. Specifically, FIG. 19 illustrates a semiconductor wafer fragment wherein bulk silicon substrate 12 is etched into prior to provision of second sacrificial oxide layer 18. Accordingly, the subsequently provided silicon sidewall spacers 37d and 38d, and second masking layer spacers 33d and 34d take on a more elongated shape. The result, referring to FIG. 20, is formation of field oxide regions 42d and 40d which are fully or substantially recessed within bulk substrate 12, such that their upper surface is substantially coincidence with the upper surface of substrate 12.

The invention also contemplates products produced by the above processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming at least one pair of field oxide regions on a semiconductor substrate comprising the following steps:

forming a first sacrificial oxide layer over a semiconductor substrate;

forming a patterned first masking layer over the first sacrificial oxide layer and over a desired active area region of the substrate, the first masking layer comprising a nitride;

removing exposed portions of the first sacrificial oxide layer;

after removing the exposed portions of the first sacrificial oxide layer, providing a second sacrificial oxide layer over the exposed substrate;

forming a layer of silicon over the patterned first masking layer of nitride and over the second sacrificial oxide layer;

forming a second masking layer over the silicon layer;

removing a portion of the second masking layer to define at least one pair of second masking layer sidewall spacers over the silicon layer and to outwardly expose portions of the silicon layer, the pair of second masking layer sidewall spacers defining an interconnected pair of masked laterally opposed and laterally outward projecting foot portions of the silicon layer;

after removing a portion of the second masking layer, removing the exposed portions of the silicon layer to form a pair of silicon sidewall spacers, the pair of silicon sidewall spacers having the pair of laterally opposed and laterally outward projecting foot portions;

oxidizing the substrate and the silicon sidewall spacers to form at least one pair of field oxide regions on the substrate;

after the oxidizing step, removing the first masking layer from the substrate;

after removing the first masking layer from the substrate, removing the second sacrificial oxide layer and any remnants of the first sacrificial oxide layer from the substrate;

after removing the second sacrificial oxide layer and any remnants of the first sacrificial oxide layer from the substrate, forming a third sacrificial oxide layer over the substrate;

removing the third sacrificial oxide layer from the substrate; and after removing the third sacrificial oxide layer from the substrate, forming a gate oxide layer over the substrate.

2. The semiconductor processing method of claim 1 wherein the silicon layer predominantly comprises polysilicon.

3. The semiconductor processing method of claim 1 wherein the silicon layer predominantly comprises amorphous silicon or porous silicon.

4. The semiconductor processing method of claim 1 wherein the second masking layer comprises an oxide.

5. The semiconductor processing method of claim 1 wherein the second masking layer comprises a nitride, the method further comprising removing the second masking layer sidewall spacers before the oxidizing step.

6. The semiconductor processing method of claim 1 wherein the silicon layer is formed to a thickness of from 200 Angstroms to 1000 Angstroms.

7. The semiconductor processing method of claim 1 wherein the second masking layer is formed to a thickness of from 200 Angstroms to 1000 Angstroms.

8. The semiconductor processing method of claim 1 wherein the silicon layer is formed to a thickness of from 200 Angstroms to 1000 Angstroms, and the second masking layer is formed to a thickness of from 200 Angstroms to 1000 Angstroms.

9. The semiconductor processing method of claim 1 wherein the second masking layer comprises an oxide, and is formed to a thickness of from 200 Angstroms to 1000 Angstroms.

10. The semiconductor processing method of claim 1 wherein the silicon layer comprises polysilicon and is formed to a thickness of from 200 Angstroms to 1000 Angstroms, and the second masking layer comprises an oxide and is formed to a thickness of from 200 Angstroms to 1000 Angstroms.

11. The semiconductor processing method of claim 1 further comprising removing the second masking layer sidewall spacers before the oxidizing step.

12. The semiconductor processing method of claim 1 further comprising removing at least a portion of the second masking layer sidewall spacers, and doing so separately from and before removing the first masking layer.

13. The semiconductor processing method of claim 1 further comprising after forming the first masking layer and before forming the second sacrificial oxide layer, etching into the substrate to ultimately form the field oxide regions substantially recessed into the substrate.

14. The semiconductor processing method of claim 13 wherein the silicon layer is formed to a thickness of from 200 Angstroms to 1000 Angstroms.

15. The semiconductor processing method of claim 13 wherein the second masking layer is formed to a thickness of from 200 Angstroms to 1000 Angstroms.

16. The semiconductor processing method of claim 13 wherein the silicon layer is formed to a thickness of from 200 Angstroms to 1000 Angstroms, and the second masking layer is formed to a thickness of from 200 Angstroms to 1000 Angstroms.

17. The semiconductor processing method of claim 13 wherein the second masking layer comprises an oxide, and is formed to a thickness of from 200 Angstroms to 1000 Angstroms.

18. The semiconductor processing method of claim 13 wherein the silicon layer comprises polysilicon and is formed to a thickness of from 200 Angstroms to 1000 Angstroms, and the second masking layer comprises an oxide and is formed to a thickness of from 200 Angstroms to 1000 Angstroms.

19. The semiconductor processing method of claim 13 further comprising removing at least a portion of the second masking layer sidewall spacers from the substrate before the oxidizing step.

20. The semiconductor processing method of claim 13 further comprising removing the second masking layer sidewall spacers, and doing so separately from and before removing the first masking layer.

* * * * *